(12) United States Patent
Chikuma

(10) Patent No.: US 7,687,922 B2
(45) Date of Patent: Mar. 30, 2010

(54) ELEMENT MOUNTING STRUCTURE AND ELEMENT MOUNTING METHOD

(76) Inventor: Tadayuki Chikuma, c/o NEC Corporation, 7-1, Shiba 5-chome, Minato-ku, Tokyo (JP)

(*) Notice: Subject to any disclaimer, the term of this patent is extended or adjusted under 35 U.S.C. 154(b) by 60 days.

(21) Appl. No.: 11/871,063

(22) Filed: Oct. 11, 2007

(65) Prior Publication Data
US 2008/0277453 A1    Nov. 13, 2008

(30) Foreign Application Priority Data
Nov. 30, 2006   (JP) ............... 2006-324216

(51) Int. Cl.
*H01L 29/41* (2006.01)
*H01L 23/12* (2006.01)
*H01L 21/00* (2006.01)
*B23K 31/00* (2006.01)

(52) U.S. Cl. ............... 257/778; 257/786; 257/E33.062; 257/E33.066; 257/E23.004; 228/114.5; 438/108

(58) Field of Classification Search ............. 228/114.5; 257/778, 786; 438/108
See application file for complete search history.

(56) References Cited

U.S. PATENT DOCUMENTS
2008/0277453 A1* 11/2008 Chikuma ............... 228/114.5

FOREIGN PATENT DOCUMENTS
EP    1 928 217 A2 *  6/2008
JP    2001021616      1/2001
JP    2001023849      1/2001

* cited by examiner

*Primary Examiner*—Evan Pert

(57) ABSTRACT

An element is mounted on a carrier by removing an oxide film sufficiently. An element mounting method in which electrodes of the element are fusion bonded to electrodes of the carrier so that the element is mounted on the carrier, the method includes the steps of: positioning the electrodes of the element at electrodes of carrier respectively, one of the electrodes of the carrier being a striped electrode in an arc shape formed on a concentric circle centered on one of the electrodes of the element, and another being a center electrode formed near the center location of the concentric circle; and then rubbing the striped electrode of the carrier and an electrode of the element together in a direction of the concentric circle centered the center electrode so as to fusion bond the electrodes.

8 Claims, 3 Drawing Sheets

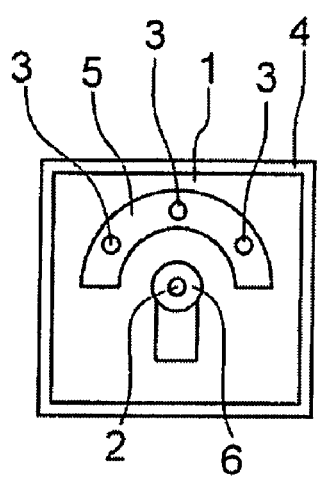
FIG. 2A
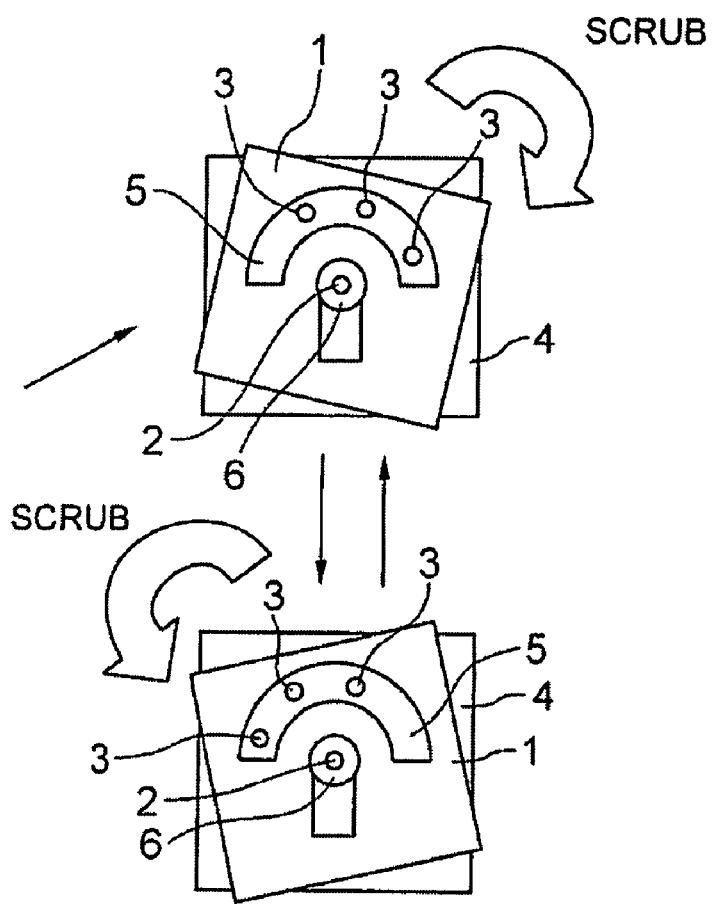
FIG. 2B
FIG. 2C

ELEMENT MOUNTING STRUCTURE AND ELEMENT MOUNTING METHOD

CROSS-REFERENCE TO RELATED APPLICATIONS

This application is based upon and claims the benefit of priority from Japanese patent application No. 2006-324216, filed on Nov. 30, 2006, the disclosure of which is incorporated herein in its entirety by reference.

BACKGROUND OF THE INVENTION

1. Field of the Invention

The present invention relates to an element mounting structure and an element mounting method in which an element to be used for optical communications is mounted on a carrier made with a material such as ceramic, with stability and high-reliability.

2. Description of the Related Art

An element to be used for the optical communications and the like is mounted on a carrier such as a ceramic carrier. In order to mount the element on the carrier, solder mounting is normally adopted, considering ensuring reliability. In the solder mounting, it is important to remove an oxide film.

As an element for the optical communications, a bare chip of light receiving elements (PIN-PD, APD) is used. The light receiving element bare chip has an electrode with small size, such as 20~100 μm in diameter $\phi$.

When the element for the optical communications is mounted on the carrier with solder mounting, fluxing, which is a general method for removing the oxide film when an electrical component is mounted using solder, cannot be used because the element might be contaminated. Moreover, the electrode of the light receiving element for the optical communications is too small to adopt a normal scrub.

So, as shown in Japanese Patent Application Laid-open No. 2001-021616 (Patent Document 1), a stage is finely moved by a micromotion unit, so that the scrub occurs when the bare chip is mounted, and then the element is mounted on the carrier. Alternatively, the scrub occurs by utilizing ultrasound, and then the element is mounted on the carrier.

Adopting the method in Patent Document 1, problems are caused when the element is mounted on the carrier. The problems will be explained with reference to drawings. As shown in FIG. 3, a light receiving element bare chip 21 is provided with a p-type electrode 22 and n-type electrodes 23. A carrier 24 is provided with a p-type electrode pad 25 and n-type electrode pads 26.

On the occasion of mounting, the p-type electrode 22 of the light receiving element 21 is positioned at the p-type electrode pad 25 on the carrier 24, and the n-type electrodes 23 are positioned at the n-type electrode pads 26 respectively, however, they cannot be scrubbed either in a X or a Y direction because the p-type electrode 22 and the p-type electrode pad 25, as well as the n-type electrodes 23 and the n-type electrode pads 26, are in the same size in each pair. Accordingly, the scrub is performed with the micromotion or the ultrasound upon mounting.

Therefore, the oxide film cannot be removed completely with the mounting method shown in Patent Document 1, and there remains a problem where stable mounting cannot be realized. Further, when the ultrasound is adopted to cause the scrub instead of the micromotion according to Patent Document 1, there is a problem in which the ultrasound damages the light receiving element.

SUMMARY OF THE INVENTION

An exemplary object of the invention is to provide an element mounting structure and an element mounting method in which the element is mounted on the carrier with the oxide film removed satisfactorily.

The present invention focuses attention on a feature of the general light receiving element, that is, a light receiving element 1 has a p-type electrode 2 and n-type electrodes 3 as shown in FIG. 1, and besides, focuses attention on the n-type electrodes 3 disposed on a concentric circle centered on the p-type electrode 2, which then realizes a most effective scrub to remove the oxide film on solder mounting in spite of small electrode size.

The element which is the light receiving element 1 including the p-type electrode 2 and the n-type electrodes 3, in which the n-type electrode 3 is disposed on the concentric circle centered on the p-type electrode 2, is disclosed in Japanese Patent Application Laid-open No. 2001-023849 (Patent Document 2).

However, the configuration in Patent Document 2 is not suitable to scrub electrodes because a ground pattern including a capacitor in an arc shaped conductor part is provided with a lot of through-hole connectors for a ground plane for increasing a ground part.

So, an element mounting method, as an exemplary aspect of the invention, is a method in which an electrode of an element is fusion bonded with an electrode of a carrier so that the element is mounted on the carrier, the method including the steps of:

positioning each electrode of the element at electrodes of the carrier, one of the electrodes of the carrier being a striped electrode in an arc shape formed on the concentric circle centered on one of the electrodes of the element, and another is a center electrode formed near the center location of the concentric circle;

rubbing the striped electrode of the carrier and the electrodes of the element in a direction of the concentric circle centered on the center electrode so as to fusion bond the electrodes.

Further, the electrodes of the element are rotated with respect to the center electrode of the carrier at the center location of the concentric circle so that those electrodes are fusion bonded. In this regard, it is desirable to rub the electrodes of the element on a continuous smooth surface of the striped electrode in the concentric circle direction centered on the center electrode so as to fusion bond the electrodes.

As an exemplary advantage according to the invention, electrodes can be scrubbed even though the electrode size of the element is small, and the element can be mounted on the carrier by removing the oxide film sufficiently.

BRIEF DESCRIPTION OF THE DRAWINGS

FIG. 2 is a diagram showing an operation to scrub the electrodes of the light receiving element bare chip and the electrodes of the carrier;

EXEMPLARY EMBODIMENT

Hereinafter, an exemplary embodiment of the invention will be described in detail with reference to drawings.

Figure 1:
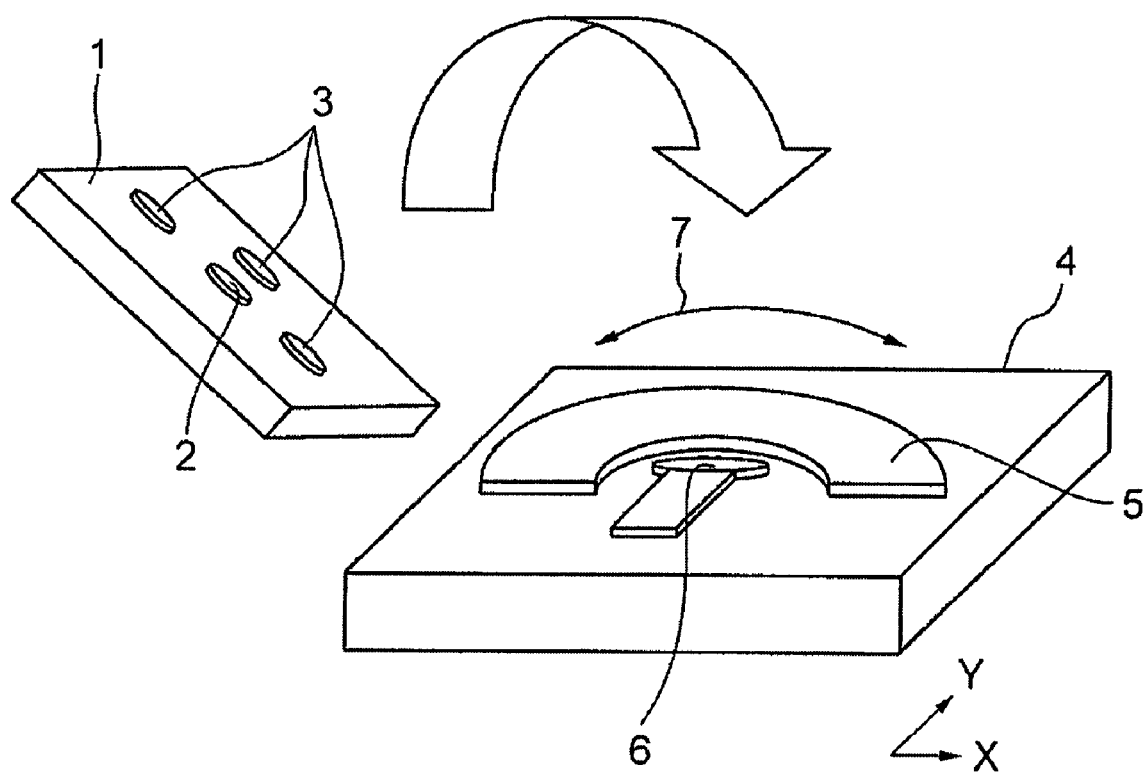
FIG. 1 is a diagram showing an element mounting structure and an element mounting method according to the exemplary embodiment.

As shown in FIG. 1, a light receiving element bare chip 1 is developed as one sort of elements for the optical communications. The light receiving element bare chip 1, as shown in FIG. 1, includes one p-type electrode 2 and a plurality of n-type electrodes 3. The plurality of n-type electrodes 3 is disposed on a concentric circle.

In the exemplary embodiment, focusing attention on the concentric circle on which the plurality of n-type electrode 3 is disposed centered on the p-type electrode 2, arrangement of the p-type electrode 2 and the n-type electrodes 3 is utilized to realize the most effective scrub to remove the oxide film upon solder mounting, even though the electrode size of the element is small.

Specifically explaining, a carrier 4 in the exemplary embodiment, as shown in FIG. 1, includes the striped electrode 5 formed in the arc shape on the concentric circle centered on one of electrodes of the light receiving element 1, that is, the p-type electrode 2, in addition, includes a center electrode 6 formed near the center location of the concentric circle.

The center electrode 6 of the carrier 4 is an electrode pad on which the p-type electrode 2 of the light receiving element bare chip 1 is rubbed so as to be fusion bonded, the striped electrode 5 of the carrier 4 is an electrode pad on which the n-type electrodes 3 of the light receiving element bare chip 1 are rubbed so as to be fusion bonded. The center electrode 6 of the carrier 4 is formed in almost the same shape and size with the p-type electrode 2 of the light receiving element bare chip 1. The striped electrode 5 of the carrier 4 is set to be a sufficiently wider width size W2 than width size W1 of the n-type electrode 3 of the light receiving element bare chip 1.

The center electrode 6 of the carrier 4 and the p-type electrode 2 and the n-type electrodes 3 of the light receiving element bare chip 1 are configured as very small Dot Electrodes. The center electrode 6 of the carrier 4, the p-type electrode 2 and the n-type electrodes 3 of the light receiving element bare chip 1, shown in FIG. 1, are in circular shapes, however, these are not limited to the above. Especially, the n-type electrodes 3 of the light receiving element bare chip 1 may be in square shapes or any other shapes, as long as the size thereof is within the width size W2 of the striped electrode 5 of the carrier 4.

Next, a case where the light receiving element 1 is mounted on the carrier 4 in the exemplary embodiment will be described in detail with reference to FIGS. 1 and 2. In this regard, the p-type electrode 2, the n-type electrodes 3, the striped electrode 5, and the center electrode 6 are shown in full line in order to show clear relative positions of the p-type electrode 2, the n-type electrodes 3, the striped electrode 5, and the center electrode 6.

As shown in FIG. 1, the carrier 4 is set on an unillustrated stage in order for the striped electrode 5 and the center electrode 6 to face upward. On the other hand, the light receiving element bare chip 1 is set on the carrier 4 in order for the p-type electrode 2 and the n-type electrodes 3 to face downward.

Maintaining the above described relationship of top and bottom, the light receiving element bare chip 1 is mounted on the carrier 4 positioning the p-type electrode 2 of the light receiving element bare chip 1 at the center electrode 6 of the carrier 4, in addition, positioning the n-type electrodes 3 of the light receiving element bare chip 1 at the striped electrode 5 of the carrier 4 (FIG. 2A).

Next, the light receiving element bare chip 1 and the carrier 4 are relatively rotated to right and left on a horizontal plane in an arc direction 7 of the stripe electrode 5, as shown in FIGS. 2B and 2C, centering on the location of the positioned p-type electrode of the light receiving element bare chip 1 and the center electrode 6 of the carrier 4.

As shown in FIGS. 2B and 2C, when the light receiving element bare chip 1 and the carrier 4 are rotated to the right and left relatively on the horizontal plane, a pressure is applied to an interval of the p-type electrode 2 of the light receiving element bare chip 1 and the center electrode 6 of the carrier 4, and an interval of the n-type electrodes 3 of the light receiving element bare chip 1 and the striped electrode 5 of the carrier 4, so that the electrodes are rubbed together, and scrubbed, and any oxide film is removed which covers the p-type electrode 2 of the light receiving element bare chip 1 and the center electrode 6 of the carrier 4, as well as the n-type electrodes 3 of the light receiving element bare chip 1 and the striped electrode 5 of the carrier 4, leads to the electrodes being fusion bonded.

In this regard, a configuration in which the p-type electrode 2 of the light receiving element bare chip 1 and the center electrode 6 of the carrier 4, and also the n-type electrodes 3 of the light receiving element bare chip 1 and the striped electrode 5 of the carrier 4 are connected respectively with fusion bonding is understood in the art, and therefore the detailed description for the above will be omitted.

According to the exemplary embodiment, the electrodes 2 and 3 of the light receiving element bare chip and the electrodes 5 and 6 of the carrier 4 are rotated in the arc direction of the striped electrode so as to be scrubbed. Therefore, the oxide film which causes the problem upon solder mounting can be removed surely, and then, stable and high reliable mounting can be realized.

According to the exemplary embodiment, the p-type electrode of the light receiving element bare chip and the center electrode of the carrier are rotated relatively in rubbed state with each other when the electrodes of the light receiving element bare chip and the electrodes of the carrier are rotated in the arc direction of the striped electrode. Accordingly, scrubbing occurs between the p-type electrode of the light receiving element bare chip and the center electrode of the carrier because of the rotation, and the oxide film which causes the problem upon solder mounting can be surely removed.

Therefore, the oxide film, which causes the problem on solder mounting, can be removed from the whole electrodes of the light receiving element bare chip and the whole electrodes of the carrier certainly, and then the light receiving element can be mounted on the carrier with stability and high-reliability.

According to the exemplary embodiment, the striped electrode of the carrier has a continuous smooth surface on which the electrodes of the light receiving element bare chip are contacted, that can ensure a stroke essential for the scrub between the electrodes of the light receiving element bare chip and the electrodes of the carrier, and the oxide film which causes the problem upon solder mounting can be removed surely.

Figure 3:
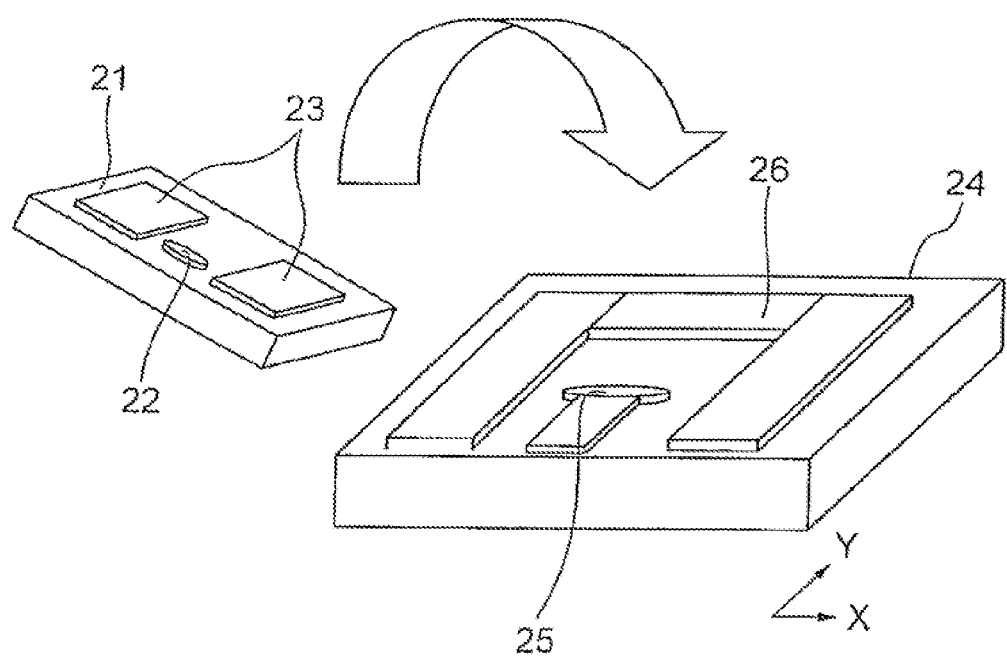
FIG. 3 is a diagram showing a relationship between the electrodes of the light receiving element bare chip and the electrodes of the carrier in the example of the related art.

According to the exemplary embodiment, the electrodes of the light receiving element bare chip and the electrodes of the carrier are scrubbed in the arc direction of the striped electrode, which ensures substantial amount of scrub for the electrodes of the light receiving element bare chip and the electrodes of the carrier even if there is not enough space to scrub them in the X-Y direction in FIG. 3.

According to the exemplary embodiment, the electrodes of the light receiving element bare chip and the electrodes of the carrier are scrubbed in the arc direction of the striped electrode so as to be fusion bonded with each other; accordingly, they do not need pseudo-scrub caused by ultrasound, which is unlike the example of the related art, and in addition, the light receiving element can be prevented from damage, and then the mounting with high-reliability can be realized.

In this regard, the exemplary embodiment adopts the light receiving element bare chip, however, a light emitting element bare chip may be used instead of the above. The point is that an element to be mounted on the carrier can be anything in the bare chip type. Further, the element do not limited to the one to be used for the optical communications.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

INDUSTRIAL APPLICABILITY

The present invention can be of use a wide range of fields, including the field of optical communications, to manufacture devices including an element with a very small electrode.

What is claimed is:

1. An element mounting structure in which an electrode of an element is fusion bonded to an electrode of a carrier so that the element is mounted on the carrier, wherein
the carrier comprises:
a striped electrode in an arc shape formed on a concentric circle centered on one electrode of of the element; and
a center electrode formed near the center location of the concentric circle.

2. The element mounting structure, as claimed in claim 1, wherein the striped electrode and the center electrode are electrode pads on which electrodes of the element are rubbed so as to be fusion bonded.

3. The element mounting structure, as claimed in claim 2, wherein the striped electrode and the center electrode have a continuous smooth surface on which electrodes of the element are rubbed.

4. The element mounting structure, as claimed in claim 2, in which the element is a bare chip element, wherein
the center electrode is an electrode pad on which a p-type electrode of the bare chip element is rubbed so as to be fusion bonded; and
the striped electrode is an electrode pad on which an n-type electrode of the bare chip element is rubbed so as to be fusion bonded.

5. An element mounting method in which electrodes of an element are fusion bonded to electrodes of a carrier so that the element is mounted on the carrier, the method comprising:
positioning the electrodes of the element at electrodes of the carrier respectively, one of the electrodes of the carrier being a striped electrode in an arc shape formed on a concentric circle centered on one of the electrodes of the element, and another is a center electrode formed near a center location of the concentric circle; and
rubbing the striped electrode of the carrier and an electrode of the element together in a direction of the concentric circle centering the center electrode so as to fusion bond the electrodes.

6. The element mounting method, as claimed in claim 5, wherein the electrodes of the element are rotated with respect to the center electrode of the carrier at a center location of the concentric circle so that the electrodes are fusion bonded.

7. The element mounting method, as claimed in claim 6, wherein the electrodes of the element are rubbed on a continuous smooth surface of the striped electrode in the direction of the concentric circle centered on the center electrode so that the electrodes are fusion bonded.

8. The element mounting method, as claimed in claim 6, wherein
a bare chip element is used as the element;
a p-type electrode of the bare chip element is rubbed on the center electrode so as to be fusion bonded; and
an n-type electrode of the bare chip element is rubbed on the striped electrode so as to be fusion bonded.

* * * * *